US008981783B2

(12) United States Patent
Fujimatsu

(10) Patent No.: US 8,981,783 B2
(45) Date of Patent: Mar. 17, 2015

(54) CELL MONITORING DEVICE FOR ELECTRIC STORAGE MODULE, NON-TRANSITORY COMPUTER READABLE MEDIUM STORING COMPUTER-READABLE INSTRUCTIONS FOR DETECTING DISCONTINUITY OF ELECTRIC LINES, AND METHOD OF DETECTING DISCONTINUITY OF ELECTRIC LINES

(75) Inventor: Masakatsu Fujimatsu, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 460 days.

(21) Appl. No.: 13/486,602

(22) Filed: Jun. 1, 2012

(65) Prior Publication Data

US 2012/0306507 A1 Dec. 6, 2012

(30) Foreign Application Priority Data

Jun. 3, 2011 (JP) .................................. 2011-124915
May 30, 2012 (JP) .................................. 2012-122692

(51) Int. Cl.
*G01N 27/416* (2006.01)
*G01R 31/36* (2006.01)
*G01R 31/02* (2006.01)

(52) U.S. Cl.
CPC .......... *G01R 31/3658* (2013.01); *G01R 31/362* (2013.01); *G01R 31/026* (2013.01)
USPC .............................. 324/434; 32/116; 32/162

(58) Field of Classification Search
CPC ......... H02J 7/0091; H02J 7/14; H02J 7/0068; Y02E 60/12; H01M 10/44; H01M 10/443; H01M 10/441; Y02B 40/90

USPC .......................................................... 324/434
See application file for complete search history.

(56) References Cited

U.S. PATENT DOCUMENTS

2006/0091861 A1* 5/2006 Melichar ....................... 320/132
2009/0015209 A1* 1/2009 Morina et al. ................ 320/153

(Continued)

FOREIGN PATENT DOCUMENTS

EP 1391962 A1 2/2004
EP 1936777 A2 6/2008

(Continued)

OTHER PUBLICATIONS

Extended European Search Report dated Sep. 21, 2012, Application No. EP 12004220, Applicant—GS Yuasa International Ltd., 6 pages.

*Primary Examiner* — Arun Williams
(74) *Attorney, Agent, or Firm* — Rankin, Hill & Clark LLP

(57) ABSTRACT

A cell monitoring device for monitoring cells connected in series in an electric storage module includes electric lines, switches connected in parallel to the cells, respectively, via the electric lines, and a controller. The controller configured to: close and reopen at least two of the switches; measure voltages between the lines connected to the cells after the switches connected in parallel to the cells are reopened; determine the measured voltages as cell voltages of the cells; determine whether at least one of a high abnormality voltage equal to or higher than a first threshold and a low abnormality voltage equal to or lower than a second threshold lower than the first threshold exists among the cell voltages; and determine at least one of the electric lines has lost continuity if at least one of the high abnormality voltage and the low abnormality voltage exists among the cell voltages.

13 Claims, 9 Drawing Sheets

(56) References Cited

U.S. PATENT DOCUMENTS

2009/0184690 A1* 7/2009 Otaka et al. .................. 320/166
2009/0309545 A1   12/2009 Kunimitsu
2010/0001693 A1*  1/2010 Iida et al. ..................... 320/134
2010/0261048 A1* 10/2010 Kim et al. .................... 429/150
2013/0041554 A1*  2/2013 Trunk .......................... 701/34.1

FOREIGN PATENT DOCUMENTS

| | | |
|---|---|---|
| JP | 2001-056350 | 2/2001 |
| JP | 2002-204537 | 7/2002 |
| JP | 2009-257923 | 11/2009 |

* cited by examiner

CELL MONITORING DEVICE FOR ELECTRIC STORAGE MODULE, NON-TRANSITORY COMPUTER READABLE MEDIUM STORING COMPUTER-READABLE INSTRUCTIONS FOR DETECTING DISCONTINUITY OF ELECTRIC LINES, AND METHOD OF DETECTING DISCONTINUITY OF ELECTRIC LINES

CROSS REFERENCE TO RELATED APPLICATION

This application claims priority from Japanese Patent Applications No. 2011-124915 filed on Jun. 3, 2011 and No. 2012-122692 filed on May 30, 2012. The entire content of these priority applications is incorporated herein by reference.

TECHNICAL FIELD

The present invention relates to a technology for detecting discontinuity of lines that connect a plurality of unit cells to a cell monitoring device.

BACKGROUND

An assembled battery device includes an assembled battery and a voltage measurement circuit. In the assembled battery, a plurality of unit batteries are connected in series. The voltage measurement circuit is connected to the unit batteries via lines and configured to monitor the unit batteries. If the lines lost continuity, the voltage measurement circuit cannot properly monitor the unit batteries. To resolve such a problem, an assembled battery device having a function for detecting discontinuity of lines is provided. The assembled battery device includes a plurality of capacitors having different capacitance and connected to the unit batteries in parallel. In this device, a variation in voltage is different in a normal condition and an abnormal condition that may be caused by the lines that has lost continuity. By detecting a difference in the voltage variation, discontinuity of the line can be detected.

The assembled battery device requires a plurality of capacitors with different capacities for detecting discontinuity of the lines. Namely, the assembled battery device has structural limitations. Therefore, a different method for detecting discontinuity of lines may be preferred.

In this specification, a new technology for detecting discontinuity of lines that connect plurality of unit cells (e.g., unit batteries) to a cell monitoring device (e.g., voltage measurement circuit).

SUMMARY

A cell monitoring device for monitoring a plurality of cells connected in series in an electric storage module includes a plurality of electric lines, a plurality of switches, and a controller. The switches are connected in parallel to the cells, respectively, via the electric lines. The controller is configured to: close and reopen at least two of the switches in a predetermined sequence; measure voltages between the electric lines connected to the cells after the switches connected in parallel to the cells are reopened and the next switch in the sequence is closed; determine the measured voltages as cell voltages of the cells; determine whether at least one of a high abnormality voltage and a low abnormality voltage exists among the cell voltages, the high abnormality voltage being equal to or higher than a first threshold, the low abnormality voltage being equal to or lower than a second threshold lower than the first threshold; and determine that at least one of the electric lines has lost continuity if at least one of the high abnormality voltage and the low abnormality voltage exists among the cell voltages.

The technologies described herein may include a cell monitoring circuit, a method of detecting discontinuity of electric lines, and a non-transitory computer readable medium. The non-transitory computer readable medium may store computer-readable instructions that, when executed, cause the cell monitoring device to perform the operations that have been described in previous paragraphs.

DETAILED DESCRIPTION

Figure 1:
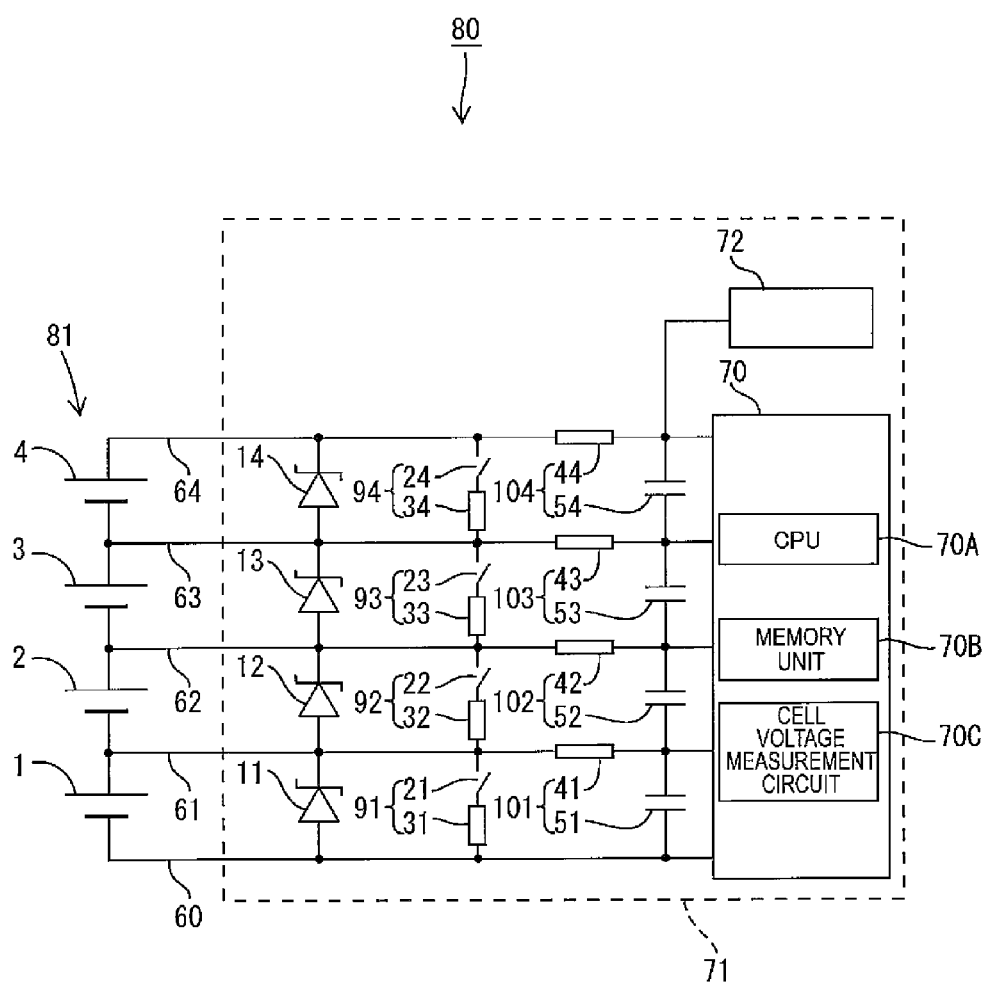
FIG. 1 is a diagram illustrating an electrical configuration of a battery pack according to a first embodiment.

In a cell monitoring device including a plurality of electric lines and a plurality of switches, at least two of the switches are closed and reopened in a predetermined sequence. After the switch is reopened and the next switch in the sequence is closed, a voltage between the electric lines connected to a cell is measured and determined as a cell voltage of the cell. In an abnormal condition in which the electric line has lost continuity, at least one of a high abnormality cell voltage and a low abnormality cell voltage exists among the measured cell voltages. The high abnormality cell voltage is higher than a voltage in a normal condition exists among the measured cell voltages. The low abnormality cell voltage is lower than a voltage in the normal condition.

Whether the measured cell voltages are the high abnormality cell voltage is determined if they are equal to of higher than a first threshold. Whether the measured cell voltages are equal to or lower than a second threshold that is lower than the first threshold. If at least one of the high abnormality cell voltage and the low abnormality cell voltage is detected, discontinuity of at least one of the electric lines is determined.

If both high abnormality cell voltage and low abnormality cell voltage are detected, discontinuity of the electric line between the cell having the high abnormality cell voltage and the cell having the low abnormality cell voltage may be determined. With this configuration, not only the discontinuity can be detected but also an area in which the electric line that has lost continuity is located can be estimated.

The at least two of the switches may be closed and reopened in a switching sequence from a first end of an electric storage module to a second end of the electric storage module. A voltage between the electric lines connected to each cell may be measured after the switch connected in parallel to the cell is reopened and the next switch in the switching sequence is closed. The measured voltage may be determined as the cell voltage of the cell. With this configuration, all electric lines connected to the cells can be properly scanned for discontinuity determination.

If the low abnormality cell voltage and the high abnormality cell voltage exist, the cell are scanned to determine if the cell voltages are the high abnormality voltage in a cell scanning sequence from the cell next to the cell having the high abnormality cell voltage. The cell scanning sequence is opposite to the switching sequence. Discontinuity of the electric line between the cell having the low abnormality cell voltage and the last one of the cells having the high abnormality cell voltage may be determined. With this configuration, not only the discontinuity of the electric line but also discontinuity of the electric line adjacent to each other between the cells having the high abnormality cell voltage can be detected.

If the low abnormality cell voltage and the high abnormality cell voltage exist, the cell are scanned to determine if the cell voltages are the low abnormality cell voltage in the cell scanning sequence from the cell next to the cell having the high abnormality cell voltage. The cell scanning sequence is equal to the switching sequence. Discontinuity of the electric line between the cell having the high abnormality cell voltage and the last cell having the low abnormality cell voltage may be determined. With this configuration, not only the discontinuity of the electric lines between the cell having the high abnormality cell voltage and the low abnormality cell voltage but also discontinuity of the electric lines adjacent to each other between the cells having the low abnormality cell voltage can be detected.

A voltage between the electric lines connected to outermost terminals of the cells may be measured as a module voltage. The first threshold and the second threshold may be altered such that the first threshold and the second threshold become lower as the module voltage becomes lower. With this configuration, the first threshold and the second threshold can be altered to a proper voltage according to a variation in charge level of the electric storage module.

The outermost cell at least one of ends of the electric storage module may be scanned to determine if the cell voltage is equal to or lower than a third threshold. The consecutive cells from the outermost cell may be scanned to determine if at least one of the cell voltages is equal to or lower than the third threshold. If the cell voltage of the at least one of the outermost cells and the consecutive cells is equal to or lower than the third threshold, the cell voltage of the at least one of the outermost cells and the consecutive cells may be determined as an edge-side abnormality cell voltage. One of the electric lines connected to the cell having the edge-side abnormality cell voltage closer to the at least one of ends of the electric storage module may be determined that is has lost continuity. With this configuration, discontinuity of the electric line on the edge side can be detected.

If a plurality of the cell voltages are the edge-side abnormality cell voltage, the cell voltages of the cells other than the farthest cell away from the outermost cell may be excluded from the scanning. With this configuration, a load in the abnormality determination can be reduced in comparison to a configuration in which all the cell voltages are examined in the abnormality determination regardless of results of the edge-side determination.

A voltage between electric lines connected to outermost terminals of the cells may be measured as a module voltage. The number of the cells having the edge-side abnormality cell voltage may be counted and subtracted from a sum of the cells. An estimated voltage is calculated by diving the number of the cells by a result of the subtraction. The first threshold and the second threshold may be altered according to the estimated voltage such that the first threshold and the second threshold become lower than the estimated voltage becomes lower. With this configuration, the first threshold and the second threshold can be properly altered according to a variation in charge level of the electric storage module and continuity of the electric lines on the edge side.

The first threshold may be altered within a range having an upper limit equal to any one of a reaction voltage of constant voltage components and the highest voltage in a measurable range of the cell voltages. With this configuration, erroneous detection of discontinuity of the electric lines due to the measurable range of the cell voltages or clamping of the constant voltage components can be reduced. The reaction voltages of the constant voltage components may vary according to a variation in temperature. The highest voltage in the measurable range may vary from a rated voltage within a predetermined range due to noise. The upper limit may be equal to the reaction voltage. However, the upper limit should not be restricted to the reaction voltage. The upper limit may vary within an estimated variable range of the reaction voltage. The upper limit may be equal to the highest voltage in the measurable range. However, the upper limit should not be restricted to the highest voltage. The upper limit may be a voltage within a predetermined range including the rated voltage.

First Embodiment

A first embodiment will be explained with reference to FIGS. 1 to 7. A battery pack 80 is an electric storage pack. The battery pack 80 includes an assembled battery module 81 and a cell monitoring device 71. The battery pack 80 may be installed in an electric vehicle or a hybrid vehicle to supply power to various kinds of devices in the vehicle.

Electric Configuration

The assembled battery module 81 is an electric storage module. The assembled battery module 81 includes four cells, which are first cell 1 to fourth cell 4, connected in series. The assembled battery module 81 may include two or three cells connected in series. The assembled battery module 81 may include five or more cells connected in series. The cells 1 to 4 are secondary batteries such as lithium ion batteries. The cells 1 to 4 may not be limited to cells and may be any other type of electric storage components such as capacitors. A battery of each cell 1 to 4 in a normal condition is in a range from 2.5 to 4.2V. The normal condition corresponds to a condition in which line discontinuity, over-discharge, and over-charge have not occurred.

The cells 1 to 4 are connected to the cell monitoring device 71 via voltage measurement lines 60 to 64. The voltage measurement lines 60 to 64 are electric lines. The voltage measurement line 60 is located at the lowest voltage side and may be referred to as a ground line 60. The rest of the voltage measurement lines may be referred to as the first measurement line 61, the second measurement line 62, the third measurement line 63, and the fourth measurement line 64 corresponding to the first to the fourth cells 1 to 4, respectively.

The cell monitoring device 71 includes zener diodes 11 to 14, equalization circuits 91 to 94, RC filters 101 to 104, a cell monitoring unit 70, and a module measurement circuit 72. The zener diodes 11 to 14 are connected to the cells 1 to 4 in parallel, respectively. With the zener diodes 11 to 14, voltages that exceed the zener voltage when the cells 1 to 4 are over-charged or surge currents occur are less likely to be applied to the cell monitoring unit 70. The zener voltage is 6.5V and a forward-biased voltage drop is 0.7V. The zener diodes 11 to 14 are constant voltage components. The constant voltage components are not limited to the zener diodes 11 to 14. Other components that maintain the voltage at a reaction voltage when a voltage applied thereto exceeds the reaction voltage.

The equalization circuits 91 to 94 are connected to the cells 1 to 4 in parallel, respectively. The equalization circuits 91 to 94 are series circuits (or discharge circuits) including switches 21 to 24 and discharge resistors 31 to 34, respectively. The switches 21 to 24 are connected to the respective discharge resistors 31 to 34 in series. The switches 21 to 24 are opened and closed by the cell monitoring unit 70. The switches 21 to 24 are semiconductor switching components such as FETs and contactors (electromagnetic contactors). Alternatively, the switches 21 to 24 may be switching elements in an IC configured to control currents. The switches 21 to 24 may be referred to as first switch 21, second switch 22, third switch 23, and fourth switch 24 corresponding to the cells 1 to 4. The cell monitoring unit 70 turns on and off (or close and open) the switches 21 to 24 to discharge the cells 1 to 4 or capacitors 51 to 54, which will be explained later. With this configuration, the voltages of the cells 1 to 4 can be equalized or a voltage across each of the capacitors 51 to 54 is equalized to the voltage of corresponding one of the cells 1 to 4.

The RC filters 101 to 104 are connected to the cells 1 to 4 in parallel, respectively. The RC filters 101 to 104 are low-pass filters including filter resistors 41 to 44 and the capacitors 51 to 54, respectively. The RC filters 101 to 104 restrict high-frequency signals to enter the cell monitoring unit 70. Capacitances of the capacitors 51 to 54 are equal.

The cell monitoring unit 70 includes a central processing unit (CPU) 70A, a memory unit 70B, and a cell voltage measurement circuit 70C. The memory unit 70B stores various programs for controlling operation of the cell monitoring unit 70 including a line discontinuity detection program. The CPU 70A controls the cell monitoring unit 70 according to the programs read from the memory unit 70B. The memory unit 70B includes a RAM and a ROM. The medium storing the programs is not limited to the RAM. A CD-ROM, a hard disk drive, or a non-volatile memory such as flash memory can be used.

The cell voltage measurement circuit 70C is connected to the cells 1 to 4 via the voltage measurement lines 60 to 64. The cell voltage measurement circuit 70C measures voltages between the voltage measurement lines 60 to 64 for the respective cells 1 to 4. The cell voltage measurement circuit 70C sends the measured voltages to the CPU 70A. The voltages measured by the cell voltage measurement circuit 70C are hereinafter referred to as measured cell voltages E1 to E4 and distinguished from actual cell voltages of the cells 1 to 4. The cell voltage measurement circuit 70C can measure the cell voltages in a range from 0V to 5V.

The module measurement circuit 72 measures the voltages between the grand line 60 and the fourth measurement line 64 for the module voltage of the assembled battery module 81. The module measurement circuit 72 sends the measured voltage to the CPU 70A. The module voltage measured by the module measurement circuit 72 is hereinafter referred to as a measured module voltage Em and distinguished from an actual module voltage of the assembled battery module 81. The cell monitoring unit 70 and the module measurement circuit 72 are configured as a controller.

Control of Cell Monitoring Device

Figure 2:
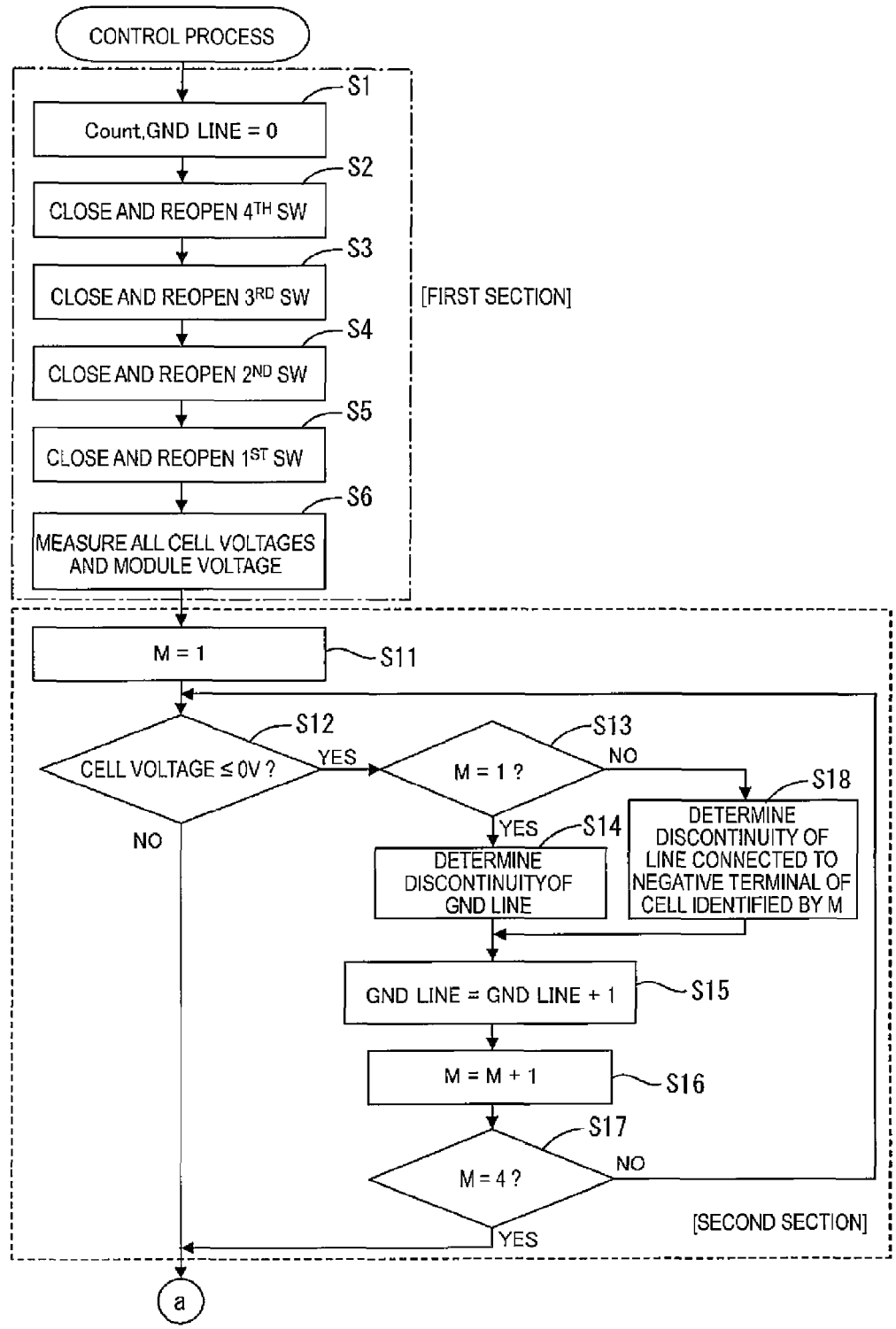
FIG. 2 is a flowchart of a first part of a control process.
Figure 3:
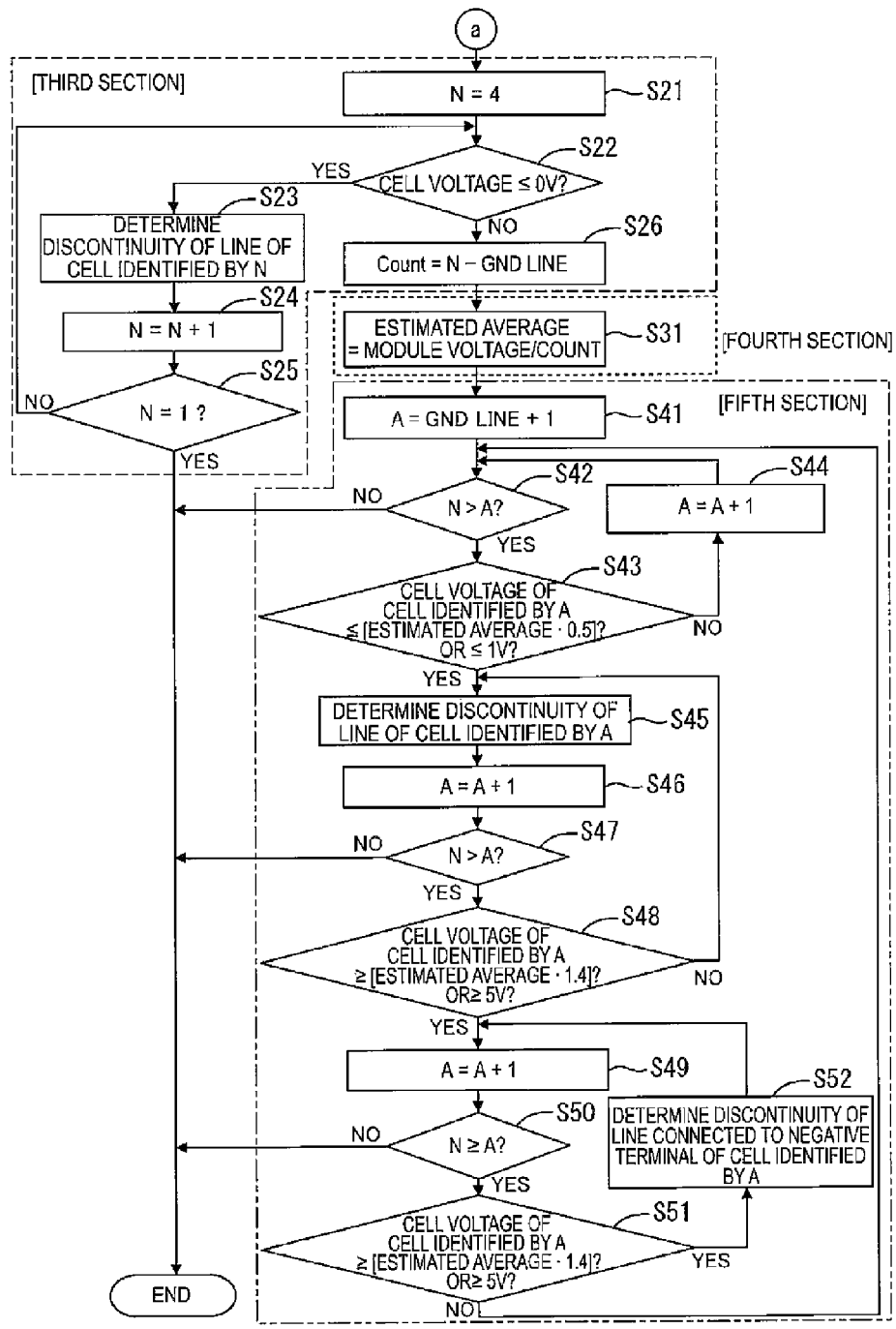
FIG. 3 is a flowchart of a second part of the control process.

When the cell monitoring unit 70 is turned on, the CPU 70A reads the program out of the memory unit 70B and executes a control process related to discontinuity of the lines illustrated in FIGS. 2 and 3. Through the control process, not only the discontinuity of the voltage measurement lines 60 to 64 is detected but also the lines 60 to 64 that have lost continuity can be determined.

In the control process, the CPU 70A executes switch control steps, and a cell voltage and module voltage measurement step ("FIRST SECTION" in FIG. 2). In step S1 of the first section of the control process, the CPU 70A initializes the number of middle cells ("COUNT" in FIG. 2) and a ground number ("GND LINE" in FIG. 2). The ground number is the number of the voltage measurement line in the sequence from the ground line having continuity. The ground line having continuity is one of the voltage measurement lines 60 to 64 having continuity and being at the lowest potential. If the ground number is zero, the ground line 60 is defined as a ground line having continuity. If the ground number is one, the first measurement line 61 is defined as a ground line having continuity.

Switch Control Steps

Next, the CPU 70A executes the switch control steps. In the switch control steps, the CPU 70A opens all switches 21 to 24 first. Then, the CPU 70A closes and reopens the switches 21 to 24 in sequence from the fourth cell 4 at the highest potential to the first cell 1 at the lowest potential (i.e., descending sequence). The CPU 70A closes the fourth switch 24 for a predetermined discharge time and reopens the fourth switch 24 (S2). The CPU 70A then closes the third switch 23 for the predetermined discharge time and reopens the third switch 23 (S3). The CPU 70A then closes the second switch 22 for the predetermined discharge time and reopens the second switch 22 (S4). The CPU 70A then closes the first switch 21 for the predetermined time and reopens the first switch 21 (S5).

Examples

With the switch control steps, the cell voltages of the cells 1 to 4 are measured by the cell monitoring unit 70 and obtained as the measured cell voltages E1 to E4. The measured cell voltages E1 to E4 vary according to the conditions of the voltage measurement lines 60 to 64 in terms of continuity. In FIGS. 4 to 7, the configuration of the cell monitoring device 71 and some reference symbols are not illustrated. In FIGS. 4 to 7, voltages next to the respective capacitors 51 to 54 are voltages across the capacitors 51 to 54 measured after the switch control steps are executed. The actual voltages of the cells 1 to 4 are 4.2V.

Figure 4:
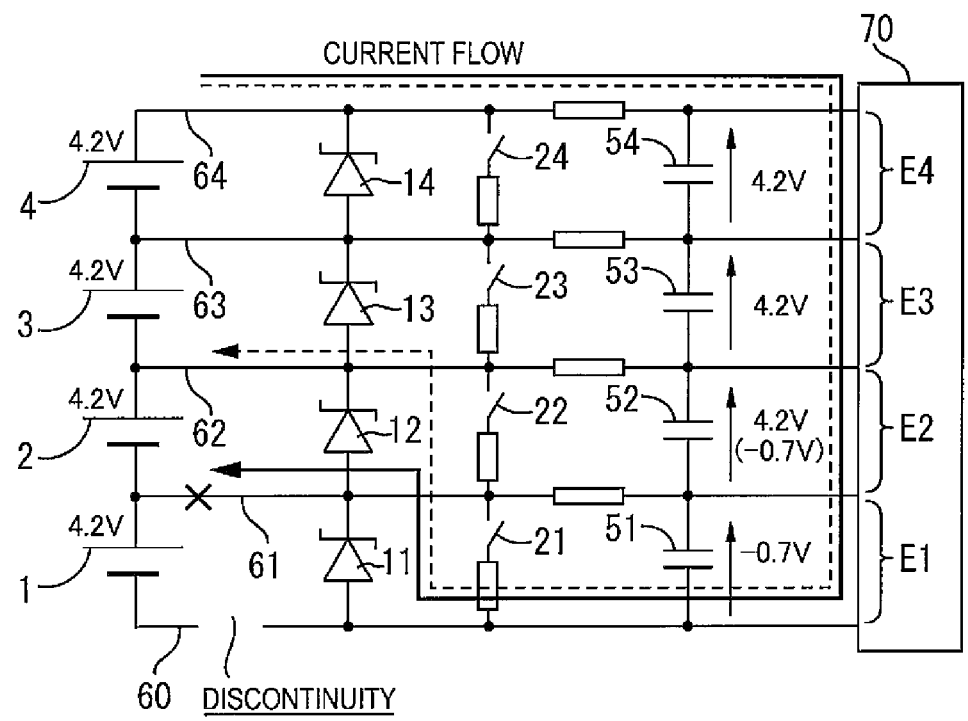
FIG. 4 is a circuit diagram of a first example.

In the first example illustrated in FIG. 4, only the ground line 60 does not have continuity. The voltage measurement lines connected to the positive and the negative terminals of the cells 2 to 4 all have continuity. Therefore, the measured cell voltages E2 to E4 are substantially equal to the actual cell voltages (4.2V) of the cells 2 to 4. The ground line 60 connected to the negative terminal of the first cell 1 does not have continuity. Therefore, a forward current flows through the zener diode 11 (indicated by a solid arrow marked as "CURRENT FLOW"). As a result, the measured cell voltage E1 becomes equal to the negative voltage corresponding to the forward voltage drop of the zener diode 11 (about −0.7V). If the voltage measurement line at the lowest potential has lost continuity, the measured cell voltage of the cell connected to the voltage measurement line is lower than the lowest voltage in the normal condition (i.e., 2.5V).

In the first example, if the first measurement line 61 has also lost continuity (indicated by "X" in FIG. 4), forward currents flow through the zener diodes 11 and 12, respectively (indicated by the solid arrow and a chain arrow marked as "CURRENT FLOW"). As a result, the measured cell voltages E1 and E2 are equal to the negative voltages corresponding to the forward voltage drops of the zener diodes 11 and 12. If the consecutive voltage measurement lines from the one at the lowest potential in the assembled battery module 81 have lost continuity, the measured cell voltages of the cells connected to the consecutive voltage measurement lines are lower than the lowest voltage in the normal condition.

Figure 5:
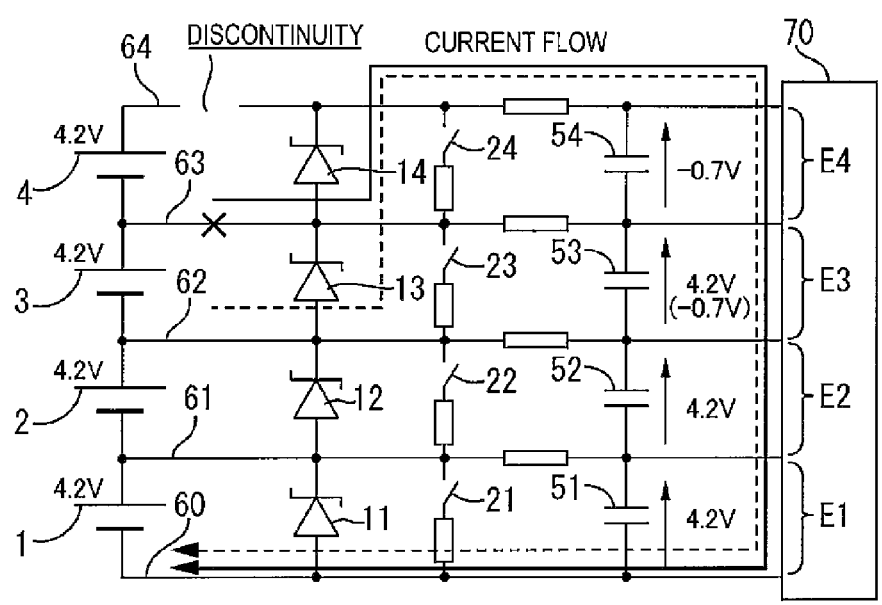
FIG. 5 is a circuit diagram of a second example.

In the second example illustrated in FIG. 5, only the fourth measurement line 64 has lost continuity. The voltage measurement lines connected to the positive and the negative terminals of the cells 1 to 3 all have continuity. Therefore, the measured cell voltages E1 to E3 are substantially equal to the actual cell voltages of the cells 1 to 3. The fourth measurement line 64 connected to the positive terminal of the fourth cell 4 has lost continuity. Therefore, a forward current flows through the zener diode 14 (indicated by a solid arrow marked as "CURRENT FLOW"). As a result, the measured cell voltage E4 is equal to the negative voltage corresponding to the forward voltage drop of the zener diode 14. If the voltage measurement line at the highest potential in the assembled battery module 81, the measured cell voltage of the cell connected to the voltage measurement line is lower than the lowest voltage in the normal condition.

In the second example, if the third measurement line 63 has also lost continuity (indicated by "X" in FIG. 5), forward currents flow through the zener diodes 13 and 14 (indicated by the solid arrow and a chain arrow marked as "CURRENT FLOW"). As a result, the measured cell voltages E3 and E4 are equal to the negative voltages corresponding the forward voltage drops of the zener diodes 13 and 14. If the consecutive voltage measurement lines from the one at the highest potential in the assembled battery module 81 have lost continuity, the measured cell voltages of the cells connected to the consecutive voltage measurement lines are lower than the lowest voltage in the normal condition.

Figure 6:
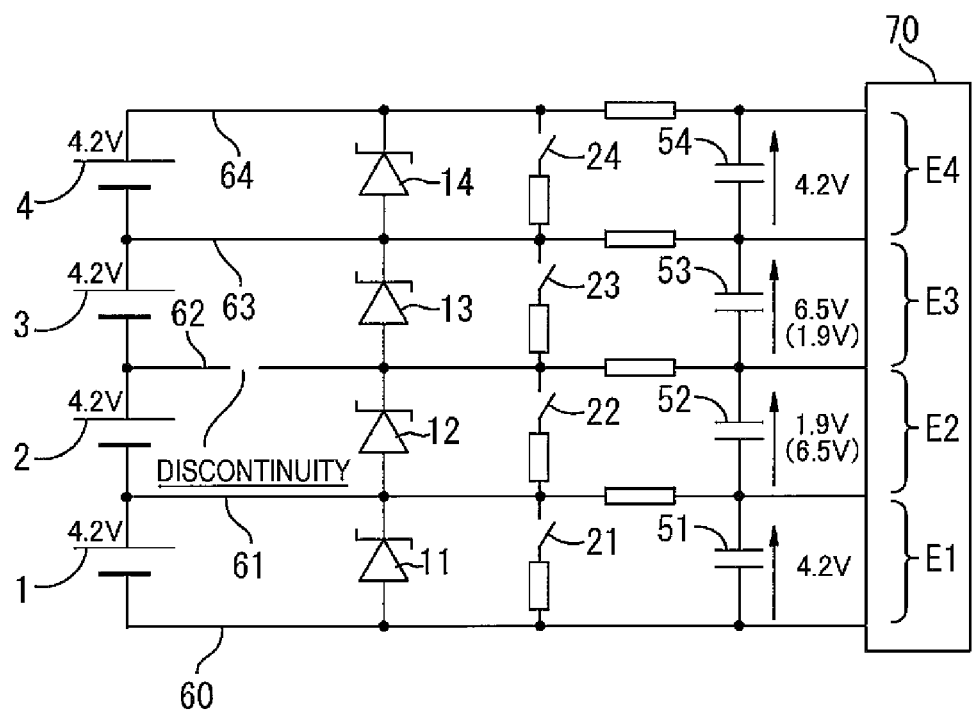
FIG. 6 is a circuit diagram of a third example.

In the third example illustrated in FIG. 6, only the second measurement line 62 has lost continuity. The voltage measurement lines connected to the positive and the negative terminals of the cells 1 and 4 all have continuity. Therefore, the measured cell voltages E1 and E4 are substantially equal to the actual cell voltages of the cells 1 and 4. Because the second measurement line 62 connected between the second cell 2 and the third cell 3 has lost continuity, the following operation occurs. When the third switch 23 is closed, the zener voltage of the zener diode 12 (6.5V) out of a total cell voltage of the cells 2 and 3 (4.2V·2=8.4V) is applied across the capacitor 52, and the remaining voltage out of the total cell voltage (8.4V−6.5V=1.9V) is applied across the capacitor 53.

When the third switch 23 is opened and the second switch 22 is closed, the zener voltage (6.5V) of the zener diode 13 is applied across the capacitor 53, and the rest of the total voltage (1.9V) is applied across the capacitor 52. In this case, the measured cell voltage E2 is 1.9V and the measured cell voltage E3 is the highest voltage (5V) in the measurable range. If one voltage measurement line without continuity exists between the voltage measurement lines having continuity and switching are performed from one at the high potential to one at the low potential, the measured cell voltage of the cell having the positive terminal to which the voltage measurement line without continuity is connected is lower than the lowest voltage in the normal condition. The measured cell voltage of the cell having the negative terminal to which the voltage measurement line without continuity is higher than the highest voltage in the normal condition.

Figure 7:
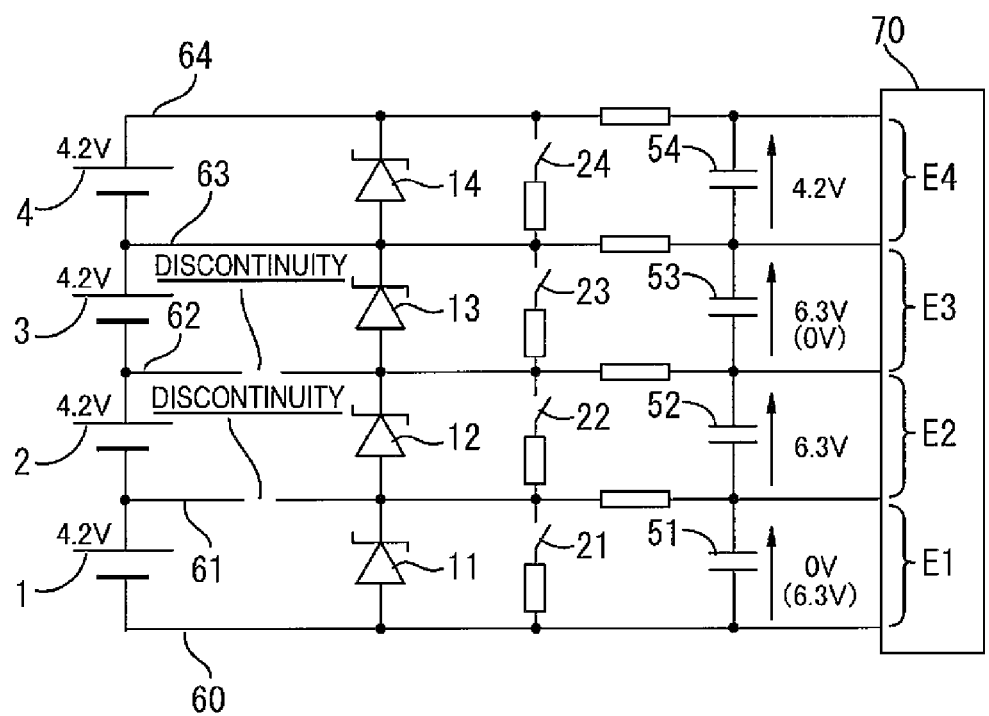
FIG. 7 is a circuit diagram of a fourth example.

In the fourth example illustrated in FIG. 7, the first measurement line 61 and the second measurement line 62 have lost continuity. The voltage measurement lines connected to the positive and the negative terminals of the fourth cell 4 all have continuity. Therefore, the measured cell voltage E4 is substantially equal to the actual cell voltage of the fourth cell 4. The first measurement line 61 and the second measurement line 62 connected among the cells 1 to 3 have lost continuity. When the switches 22 and 23 are opened and the first switch 21 is closed, substantially 0V is applied across the capacitor 51, and a total cell voltage of the cells 1 to 3 (4.2V·3=12.6V) is divided by the capacitors 52 and 53. In this case, the measured cell voltage E1 is substantially 0V and the measured voltages E2 and E3 are 5V.

The measured voltage E3 may be clamped to the zener voltage (6.5V) and the measured voltage E2 may be 6.1V (12.6V−6.5V). In such a case, the measured cell voltage E2 may be equal to the cell voltage in the normal condition or lower if the module voltage is relatively low. If the voltage measurement lines without continuity exist between the voltage measurement lines having continuity and the switching is performed from the one at the high potential to the one at the low potential, the measured cell voltage of the cell having the positive terminal to which the voltage measurement line without continuity at the lowest potential is lower than the lowest voltage in the normal condition. The measured cell voltage of the cell having the negative terminal to which the measurement line without continuity at the highest potential is higher than the highest voltage in the normal condition. The measured cell voltages of the cells at other than the lowest or the highest potential may be smaller than the lowest voltage in the normal condition or higher than the highest voltage in the normal condition.

Cell Voltage Measurement and Module Voltage Measurement Step

Next, the CPU 70A executes the cell voltage measurement and module voltage measurement step (S6). The CPU 70A obtains the measurements from the cell voltage measurement circuit 70C, and stores the measured cell voltages E1 to E4 in the memory unit 70B after associating them with the respective cells 1 to 4. The CPU 70A obtains the measurements from the module measurement circuit 72 and stores the measured module voltage Em in the memory unit 70B.

Low Potential-side Steps

Next, the CPU 70A executes low potential-side steps ("SECOND SECTION" in FIG. 2). Through the low potential-side steps, the CPU 70A determines the ground number based on the number of the consecutive voltage measurement lines from the ground line 60 at the lowest potential. The low potential-side steps may be an abnormal condition detection process.

The CPU 70A sets the number M in the sequence from the ground to 1 (S11). The numbers 1, 2, 3 and 4 for the number M indicate the first cell 1, the second cell 2, the third cell 3, and the fourth cell 4, respectively. The CPU 70A then executes edge-side line determination steps. Through the edge-side line determination steps, the CPU 70A determines whether the measured cell voltage E1 of the first cell 1 at the lowest potential is the edge-side abnormal cell voltage. If the measured cell voltage E1 of the first cell 1 is the abnormal cell voltage, the CPU 70A determines whether the measured cell voltages E2 to E4 of the second to the fourth cells 2 to 4 are the abnormal cell voltage consecutively. The edge-side abnormal cell voltage is determined if the measured cell voltage is equal to or lower than an edge-side line threshold. The edge-side line threshold may be a third threshold. The edge-side line threshold may be preferably set equal to or lower than a low abnormal threshold, which will be explained later, more preferably lower than the low abnormal threshold. The edge-side line threshold can be set based on an experiment. In consideration of noise, the edge-side line threshold may be set within a predetermined range (e.g., 0V to 0.1V). In the following description, the edge-side line threshold is set to 0V.

The CPU 70A determines whether the measured cell voltage E1 of the first cell 1 is equal to or lower than the edge-side line threshold (S12). If the measured cell voltage E1 is higher than the edge-side line threshold (NO in S12), the CPU 70A determines that an abnormal cell voltage is not measured on the lowest potential edge side. Then, the CPU 70A proceeds to high potential-side steps. The ground number is set to 0 and the ground line 60 is set as a ground line having continuity.

If the measured cell voltage E1 is equal to or lower than the edge-side line threshold (YES in S12), the CPU 70A determines that the measured cell voltage E1 is the edge-side abnormal cell voltage. The CPU 70 determines whether the number M set to 1 (S13). If the number M is set to 1 (YES in S13), the CPU 70 determines that the ground line 60 connected to the negative terminal of the first cell 1 has lost continuity (S14), and add 1 to the ground number (S15). Namely, the first measurement line 61 may be the ground line having continuity instead of the ground line 60. Next, the CPU 70A adds 1 to the number M (S16) and determines whether the number M reaches the total number of the cells, which is 4 in this embodiment (S17). If the number M has not reached 4 (NO in S17), the CPU 70A returns to step S12.

If the measured cell voltage of the cell identified with the number M larger than 1 is equal to or lower than the edge-side line threshold (YES in S12), the CPU 70A determines that the voltage measurement line connected to the negative terminal of the cell identified with the M has lost continuity (S18) and proceeds to step S15. Steps S14 and S18 may be the edge-side discontinuity detection steps. If the number M has reached 4 (YES in S17), the number M at this moment is determined as the ground number and the voltage measurement line connected to the positive terminal of the cell identified by the number M is determined as the ground line having continuity.

Examples

In the first example in FIG. 4, the measured cell voltage E1 is equal to or lower than the edge-side line threshold (YES in S12) and thus the ground line 60 is determined that it has lost continuity (S14). The measured cell voltage E2 is higher than the edge-side line threshold (NO in S12). The ground number is set to 1 and the first measurement line 61 is determined as the ground line having continuity.

If the first measurement line 61 also has lost continuity in the first example, the measured cell voltage E2 is also equal to or lower than the edge-side line threshold (YES in S12). Therefore, the CPU 70A determines that the first measurement line 61 has lost continuity (S18). The measured cell voltage E3 is higher than the edge-side line threshold (NO in S12). The ground number is set to 2 and the second measurement line 62 is determined as the ground line having continuity. Namely, the CPU 70A determines that not only the ground line 60 but also the consecutive voltage measurement lines from the ground line 60 have lost continuity. In the second to the fourth examples, the measured cell voltage E1 is higher than the edge-side line threshold (NO in S12). Therefore, the detection of discontinuity of the voltage measurement line on the low potential side is not performed and the low potential side steps are terminated.

High Potential-Side Steps

After the low potential-side steps, the CPU 70A executes high potential-side steps ("THIRD SECTION" in FIG. 3). In the high potential-side steps, the CPU 70A determines whether the voltage measurement line(s) located consecutively from the fourth measurement line 64 at the highest potential has lost continuity. The CPU 70A then determines a high potential number that is the number of the voltage measurement line in the sequence corresponding to the highest potential line having continuity. The highest potential line having continuity is one of the voltage measurement lines 60 to 64 having continuity and being at the highest potential. The high potential-side steps may be an abnormality determination process.

The CPU 70A sets the number N (S21). The number N identifies the cells. The number N set to 4 identifies the fourth cell 4. The number N set to 3 identifies the third cell 3. The number N set to 2 identifies the second cell 2. The number N set to 1 identifies the first cell 1. The number N at the end of the high potential-side steps is the high potential number. Then, the CPU 70A executes edge-side line determination steps. In the edge-side line determination steps, the CPU 70A first determines whether the measured cell voltage E4 of the fourth cell 4 at the highest potential is an edge-side abnormal cell voltage. If the measured cell voltage E4 is the edge-side abnormal cell voltage, the CPU 70A determines whether the measured cell voltages E3 to E1 of the cells 3 to 1 consecutively from the fourth cell 4 are the edge-side abnormal cell voltage.

The CPU 70A determines whether the measured cell voltage E4 of the fourth cell 4 is equal to or lower than the edge-side line threshold (S22). If the measured cell voltage E4 is higher than the edge-side line threshold (NO in S22), the CPU 70A determines that the edge-side abnormal cell voltage does not exist on the high potential side. Then, the CPU 70 proceeds to a threshold alteration step. The high potential number is set to 4 and the fourth measurement line 64 is determined as the high potential line having continuity.

If the measured cell voltage E4 is equal to or lower than the edge-side line threshold (YES in S22), the CPU 70A is determines that the measured cell voltage E4 is the edge-side abnormal cell voltage. The CPU 70A determines that the fourth measurement line 64 connected to the positive terminal of the fourth cell 4 has lost continuity (S23). Then, the CPU 70A subtracts 1 from the number N (S24) and determines if the number N after the subtraction becomes 1 (S25). If the number N is 1 (YES in S25), the CPU 70A determines that all of the voltage measurement lines 60 to 64 have lost continuity, and terminates the control process. When the discontinuity of the voltage measurement lines is detected, information on the discontinuity may be better to be sent to an external device such as a controller in a vehicle.

If the number N after the subtraction is not 1 (NO in S25), the CPU 70A returns to step S22. If the measured cell voltage of the cell identified by the number N in the next (<4) is equal to or lower than the edge-side line threshold (YES in S22), the CPU 70A repeats steps S23 to S25. If the measured cell voltage of the cell identified by the number N (<4) is higher than the edge-side line threshold (NO in step S22), the CPU 70A determines that the number N at this time is the high potential number. The CPU 70A subtract the ground number from the number N and set a result of the subtraction as the number of the middle cells (S26). Then, the CPU 70A proceeds to the threshold alteration step. The number of the middle cells is a sum of the cells connected between the high potential line having continuity and the ground line having continuity (hereinafter referred to as the middle cells).

Examples

In the second example in FIG. 5, the measured cell voltage E4 is equal to or lower than the edge-side line threshold (YES in S22). The CPU 70A determines that the fourth measurement line 64 has lost continuity (S23). The measured cell voltage E3 is higher than the edge-side line threshold (NO in S12). Because the high potential number is set to 3 and the ground number is 0, the number of the middle cells is 3.

If the third measurement line 63 in the second example also has lost continuity, the measured cell voltage E3 is also equal to or lower than the edge-side line threshold (YES in S22), the CPU 70A determines that the third measurement line 63 has lost continuity (S23). The measured cell voltage E2 is higher than the edge-side line threshold (NO in S22). Because the high potential number is set to 2 and the ground number is 0, the number of the middle cells is 2. The CPU 70A determines that not only the fourth measurement line 64 has lost continuity but also the consecutive voltage measurement lines from the fourth measurement line 64 have lost continuity. In the first, the third, and the fourth examples, the measured cell voltage E4 is higher than the edge-side line threshold (NO in S22), the discontinuity of the voltage measurement lines on the high potential side is not detected and the CPU 70A terminates the high potential-side steps.

Threshold Alteration Step

The CPU 70A executes the threshold alteration step ("FOURTH SECTION" in FIG. 3) after the high potential-side steps. In the threshold alteration step, the CPU 70A alters a high abnormality threshold and a low abnormality threshold, which will be explained later, according to a variation in measured module voltage Em. The CPU 70A calculates an estimated average of the cell voltages by dividing the measured module voltage Em obtained in step S6 by the number of the middle cells (S31). The high abnormality threshold and the low abnormality threshold are calculated by multiplying the estimated average by a predetermined coefficient. Therefore, the high abnormality threshold and the low abnormality threshold vary according to the variation in the estimated average. Namely, the high abnormality threshold and the low abnormality threshold can be properly altered according to a variation in charge level of the assembled battery module 81 and continuity of the voltage measurement lines on the edge side.

Middle Portion Steps

The CPU 70A executes middle portion steps ("FIFTH SECTION" in FIG. 3) after the threshold alteration step. In the middle portion steps, the CPU 70A determines whether the measured cell voltages of the middle cells are a high abnormality cell voltage or low abnormality cell voltage. Then, the CPU 70A determines whether the voltage measurement lines between the high potential line having continuity and the ground line having continuity (hereinafter referred to as middle measurement lines) based on the result of the above determination.

The CPU 70A sets the number A to a value calculated by adding 1 to the ground number (S41). The measured cell voltage of the cell identified by the number A is first selected as a subject for the following steps. The CPU 70A determines whether the middle measurement lines exist by comparing the high potential number N with the number A (S42). If the high potential number N is equal to or smaller than the number A (NO in S42), the CPU 70A determines that no middle measurement lines exist and terminates the steps.

If the high potential number N is larger than the number A, the CPU 70A determines that at least one middle measurement line exists, and starts low abnormality finding steps. In the low abnormality finding steps, the CPU 70A determines whether the measured cell voltages of the middle cells are the low abnormality cell voltage. The cells are scanned in an ascending sequence from the middle cell at the lowest potential to the middle cell at the highest potential. The sequence of scanning the cells is in the reverse of the sequence of switching in the switch control steps.

The CPU 70A determines whether the measured cell voltage of the cell identified by the number A is the low abnormal cell voltage (S43). The low abnormal cell voltage is the measured cell voltage equal to or lower then the low abnormality threshold. The low abnormality threshold may be a second threshold. The low abnormality threshold may be preferably set in consideration of variations in cell voltages E1 to E4 and an acceptable measurement error range of the cell voltage measurement circuit 70C. The low abnormality threshold may be set preferably lower than the overdischarge threshold used for determination on whether the cell is in an overcharged condition. In this embodiment, the low abnormality threshold is calculated by multiplying the estimated average obtained in step S31 by a predetermined coefficient. The low abnormality threshold varies according to a variation in the estimated average. The coefficient is preferably determined in consideration of variations in actual cell voltages, errors, and forward voltage drops in the zener diodes 11 to 14. In following description, the coefficient is set to 0.5.

The lower limit of the range in which the low abnormality threshold can be altered is defined. This is because the discontinuity of the middle measurement lines may not be detected if the measured module voltage Em is relatively low. In the fourth example in FIG. 7, the measured cell voltage E1 may be assumed to be substantially zero. However, the measured cell voltage E1 may measure a few hundred millivolts due to resistance that appears when the switch 21 is closed.

If the measured cell voltage E1 is 0.8V and the estimated average is 1.5V because the measured module voltage Em is relatively small, the low abnormality threshold is 0.75 (1.5V·0.5). Because the measured cell voltage E1 is higher than the low abnormality threshold, the discontinuity of the first measurement line 61 cannot be detected. Therefore, the lower limit is defined for the alteration range of the low abnormality threshold. The lower limit can be defined based on an experiment. In consideration of noise, the lower limit may be set within a predetermined range (e.g., 0.8V to 1.2V). In the following description, the edge-side line threshold is set to 1V.

If the measured cell voltage identified by the number A is higher than the low abnormality threshold (No in S43), the CPU 70A determines that the measured cell voltage is not the low abnormality cell voltage. Then, the CPU 70A adds 1 to the number A (S44) and returns to step S42. The CPU 70A determines whether the measured cell voltage is the low abnormal voltage until the number A reaches the high potential number N (NO in S42). If no measured cell voltage is the low abnormal voltage, the CPU 70A determines that the middle measurement lines have not lost continuity and terminates the steps.

If the measured cell voltage of the cell identified by the number A is equal to or lower than the low abnormal threshold (YES in S43), the CPU 70A determines that the measured cell voltage is the low abnormal cell voltage and the middle measurement line connected to the positive terminal of the cell has lost continuity (S45). The CPU 70A adds 1 to the number A (S46) and determines whether the number A after the addition is equal to or larger than the high potential number N (S47). If the number A exceeds the high potential number N (NO in S47), the CPU 70A determines that all the middle measurement lines are scanned for determining whether the discontinuity exists and terminates the control process.

If the number A is equal to or smaller than the high potential number N (YES in S47), the CPU 70A determines that the middle measurement line that is not scanned exists and starts the high abnormality finding steps. In the high abnormality finding steps, the CPU 70A determines whether the measured cell voltages of the middle cells are the high abnormality cell voltage. The cells are scanned in the cell scanning sequence.

The CPU 70A determines whether the measured cell voltage of the cell identified by the number A is the high abnormality cell voltage (S48). The high abnormality cell voltage is the measured cell voltage higher than the high abnormality threshold. The high abnormality threshold may be a first threshold. The high abnormality threshold may be preferably set in consideration of variations in cell voltages E1 to E4 and an acceptable measurement error range of the cell voltage measurement circuit 70C. The high abnormality threshold may be set preferably higher than the overdischarge threshold used for determination on whether the cell is in an overcharged condition. In this embodiment, the high abnormality threshold is calculated by multiplying the estimated average obtained in step S31 by a coefficient. The high abnormality threshold varies according to a variation in the estimated average. The coefficient is preferably defined in consideration of variations in the actual cell voltages, errors, or zener voltages, or based on an experiment. In the following specification, the coefficient is 1.4.

The upper limit of the range in which the high abnormality threshold can be altered is defined. The discontinuity may be incorrectly detected under an influence of the measurable range of the cell voltage measurement circuit 70C or the zener voltages of the zener diodes 11 to 14. By setting the upper limit, such incorrect detection can be reduced. In the third example in FIG. 6, the measured cell voltage E3 is 5V. If the measured module voltage Em is relatively high and thus the estimated average is 4.2V, the high abnormality threshold is 5.88V (4.2V·1.4). In this case, the measured cell voltage E3 is equal to or lower than the high abnormality threshold. Therefore, the CPU 70A determines that the measured cell voltage E3 is not the high abnormality cell voltage. As a result, the discontinuity of the first measurement line 61 cannot be detected. For that reason, the high abnormality threshold range has the upper limit.

The upper limit may be preferably equal to either one of the highest voltage in the measurable range of the cell voltages and the zener voltage of the zener diodes 11 to 14, whichever is smaller. In consideration of noise, the upper limit may be set within a predetermined range (e.g., 4.9V to 5.1V) including the highest voltage (5V) or a predetermined range (6.4V to 6.6V) including the estimated zener voltage (6.5). In the following description, the upper limit is set to 5V. In the following description, the upper limit is 5V.

The CPU 70A determines whether the measured cell voltage of the cell identified by the number A is smaller than the high abnormality threshold (S48). If the measured cell voltage is lower than the high abnormality threshold (NO in S48), the CPU 70A returns to step S45. The CPU 70A determines that the middle measurement line connected to the positive terminal of the cell identified by the number A has lost continuity and adds 1 to the number A (S46). Then, the CPU 70A proceeds to step. Through these steps, the discontinuity of the voltage measurement lines between the cell at the low abnormality cell voltage and the cell at the high abnormality cell voltage can be detected. If the measured cell voltage of the cell identified by the number A is equal to or higher than the high abnormality threshold (YES in S48), the CPU 70A adds 1 to the number A (S49). The CPU 70A determines whether the number A after the addition exceeds the high potential number N (S50). If the number A exceeds the high potential number N (NO in S50), the CPU 70A determines that the middle measurement lines are all scanned and terminates the control process.

If the number A is equal to or lower than the high potential number N (YES in S50), the CPU 70A determines that the middle measurement lines that have not been scanned exist and starts the non-high abnormality finding steps. In the non-high abnormality finding steps, the CPU 70A determines whether the measured cell voltages of the middle cells are the high normality cell voltage in the cell scanning sequence.

The CPU 70A determines whether the measured cell voltage of the cell identified by the number A is lower than the high abnormality threshold (S51). If the measured cell voltage is lower than the high abnormality threshold (NO in S51), the CPU 70A returns to step S42. In this case, the CPU 70A determines that the middle measurement line of the cell identified the number A−1 has continuity. If the measured cell voltage is equal to or higher than the high abnormality threshold (YES in S51), the CPU 70A determines that the middle measurement line of the cell identified the number A−1 has lost continuity (S52) and returns to step S49. Through these steps, the discontinuity of the adjacent measurement lines between the cells at the high normality cell voltage can be detected. Steps S45 and S52 may be the discontinuity detection process.

Examples

In the third example in FIG. 6, the measured cell voltage E2 is determined as the low abnormality cell voltage (YES in S43) in the low normal abnormality finding steps and the measured cell voltage E3 is determined as high normal cell voltage (YES in S48) in the high abnormality finding steps. As a result, the second measurement line 62 connected between the second cell 2 and the third cell 3 is detected as a line that has lost continuity (S45). In non-high abnormality finding steps, the measured cell voltage E4 is determined that it is not the high abnormality cell voltage (YES in S51). As a result, the third measurement line 63 connected between the third cell 3 and the fourth cell 4 has continuity.

In the fourth example in FIG. 7, the results obtained through the low abnormality finding steps and the high abnormality fining steps are the same as those in the third example. The measured cell voltage E4 is determined as the high abnormality cell voltage (NO in S51) in the non-high abnormality finding steps. Therefore, the discontinuity of the third measurement line 63 connected between the third cell 3 and the fourth cell 4 is detected. In the first example and the second example, no low abnormality cell voltage measures in the low abnormality finding steps (NO in S42) in the low abnormality finding steps and the middle portion steps are terminated.

Effects

The switches 21 to 24 in open state are closed and reopened in sequence. A pair of the voltage measurement lines connected to each of the cells 1 to 4. The voltage between the voltage measurement lines is measured after the switch connected to the corresponding cell in parallel is reopened and the next switch in the sequence is closed. The measured voltage is referred to as the measured voltage of the corresponding cell 1, 2, 3 or 4.

In the abnormal condition in which the voltage measurement line has lost continuity, at least one of the measured cell voltages E1 to E4 is at least one of the high normality cell voltage and the low abnormality voltage. If only the voltage measurement line on the edge side among all voltage measurement lines has lost continuity, the cell at the low abnormality cell voltage exists. If only the middle voltage measurement line among all voltage measurement lines has lost continuity, the cells at the high abnormality cell voltage and the low abnormality cell voltage exists. The cell monitoring device 80 determines whether any of the measured cell voltages E1 to E4 are the high abnormality cell voltage or the low abnormality cell voltage. The cell monitoring device 80 determines whether the voltage measurement lines have lost continuity based on results of the above determination.

If multiple cells having the edge-side abnormality cell voltage are detected in the low potential steps and the high potential steps, the cell monitoring device 80 only examines the measured cell voltage of the farthest inner cell away from the outermost cell in the middle portion steps among the cells at the edge-side abnormality cell voltage. With this configuration, a load of the cell monitoring device 80 can be reduced in comparison to a configuration in which all the cell voltages E1 to E4 are examined regardless of results of the low potential-side steps and the high potential-side steps.

Second Embodiment

Figure 8:
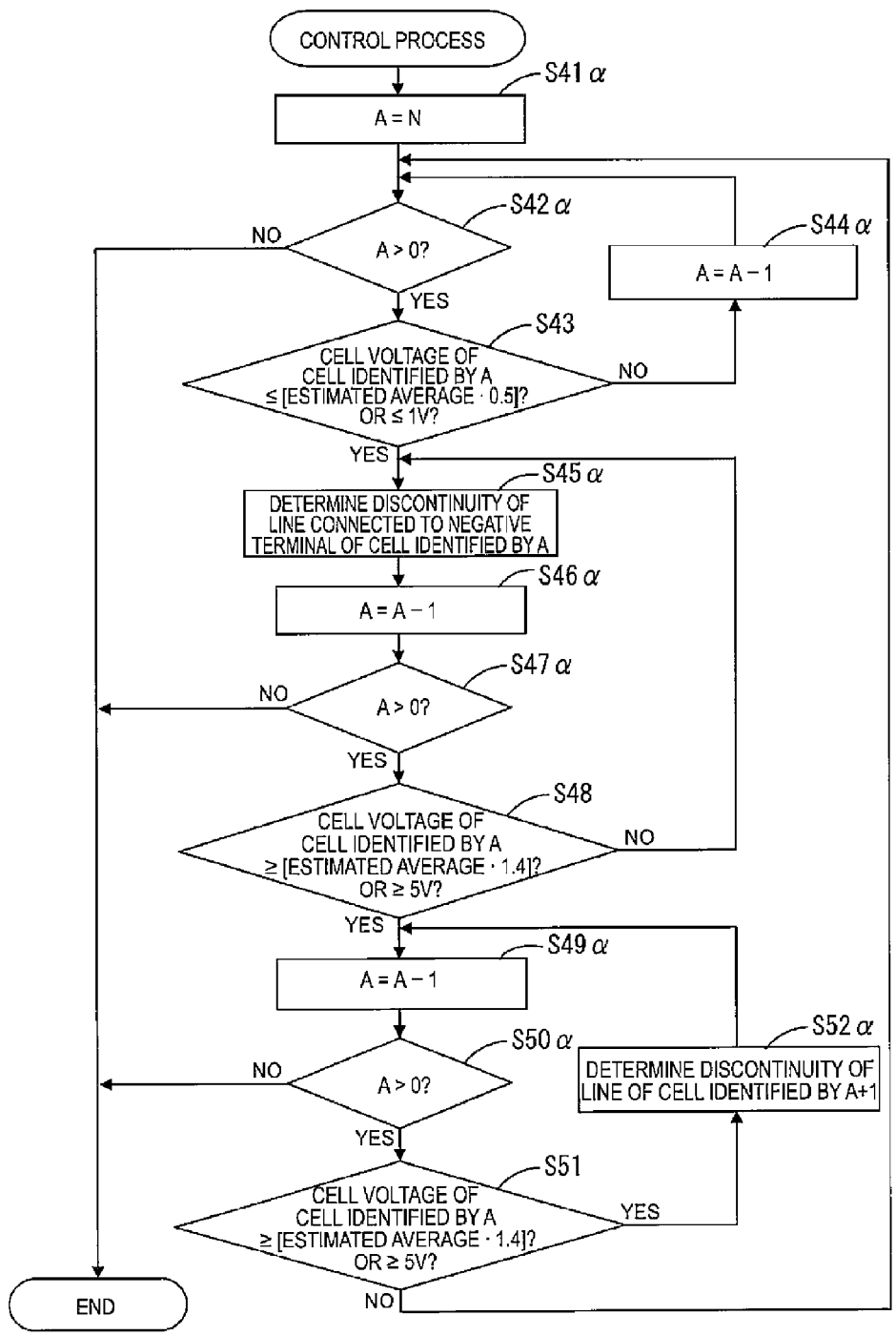
FIG. 8 is a flowchart illustrating a middle portion steps according to a second embodiment.

Middle portion steps of the second embodiment illustrated in FIG. 8 are different from those in the first embodiment. Other configurations are the same as those of the first embodiment. Steps indicated by step numbers followed by letter α are different from the middle steps in the first embodiment (FIG. 3). The same configurations as those of the first embodiment will be indicated by the same symbols and will not be explained. The configuration different from those of the first embodiment will be explained.

Switching sequence in switch control steps and scanning sequence of scanning the cells in the middle portion steps are reversed from those of the first embodiment. In the first embodiment, the switching sequence is the descending sequence and the scanning sequence is the ascending sequence. In this embodiment, the switching sequence is the ascending sequence and the scanning sequence is the descending sequence. Namely, the switching steps in this embodiment are executed in reverse sequence of steps S2 to S5 in FIG. 2. Through the switch control steps, a voltage across each capacitor 51, 52 or 53 in the third and the fourth examples in FIGS. 6 and 7 measures the voltage in parenthesis.

In the middle portion steps, the CPU 70A set the number A to the high potential number N (S41α). The measured voltage of the cell identified by the number A is a subject for the following steps. The CPU 70A determines whether the number N is larger than 0 (S42α). If the number N is 0 (NO in S42α), the CPU 70A determines that no middle lines exist and terminates the control process. If the number N is larger than 0 (YES in S42α), the CPU 70A executes the low abnormality finding step and determines whether the measured cell voltage of the cell identified by the number A is equal to or lower than the low abnormality threshold (S43). If the measured cell voltage is higher than the low abnormality threshold (NO in S43), the CPU 70A subtracts 1 from the number A (S44α) and returns to step S42α.

If the measured cell voltage of the cell identified by the number A is equal to or lower than the low abnormality threshold (YES in S43), the CPU 70A determines that the middle measurement line connected to the positive terminal of the cell identified by the number A−1 has lost continuity (S45α). The CPU 70A subtracts 1 from the number A (S46α) and determines whether the number A after the subtraction is larger than 0 (S47α). If the number A is 0 (NO in S47α), the CPU 70A determines that no middle measurement lines that have not been scanned exist and terminates the control process.

If the number A is larger than 0 (YES in S47α), the CPU 70A determines that the middle measurement lines that have not been scanned exist and executes the high abnormality finding step (S48). The CPU 70A determines whether the measured cell voltage of the cell identified by the number A is equal to or higher than the high abnormality threshold in the high abnormality finding step.

If the measured cell voltage of the cell identified by the number A is lower than the high abnormality threshold (NO in S48), the CPU 70A returns to step S45α. If the measured cell voltage is equal to or higher than the high abnormality threshold (YES in S48), the CPU 70A subtracts 1 from the number A (S49α). The CPU 70A determines whether the number A after the subtraction is larger than 0 (S50α). If the number A is (NO in S50α), the CPU 70A determines that the middle measurement lines are all scanned and terminates the control process.

If the number A is larger than 0 (YES in S50α), the CPU 70A determines that the middle measurement lines that have not been scanned exist and executes the non-high abnormality finding step (S51). The CPU 70A determines whether the measured cell voltage of the cell identified by the number A is equal to or higher than the high abnormality threshold in the non-high abnormality finding step. If the measured cell voltage is lower than the high abnormality threshold (NO in S51), the CPU 70A returns to step S42. The CPU 70A determines that the middle measurement line connected to the positive terminal of the cell identified by the number A−1 has continuity. If the measured voltage of the cell identified by the number A is equal to or higher than the high abnormality threshold (YES in S51), the CPU 70A determines that the middle measurement line connected to the positive terminal of the cell indicated by the number A+1 has lost continuity (S52α) and returns to step S49α. Through these steps, the discontinuity of the voltage measurement lines between the cells at the high abnormality cell voltage can be also detected. Steps S45α and 52α may be the discontinuity detection steps.

Third Embodiment

Figure 9:
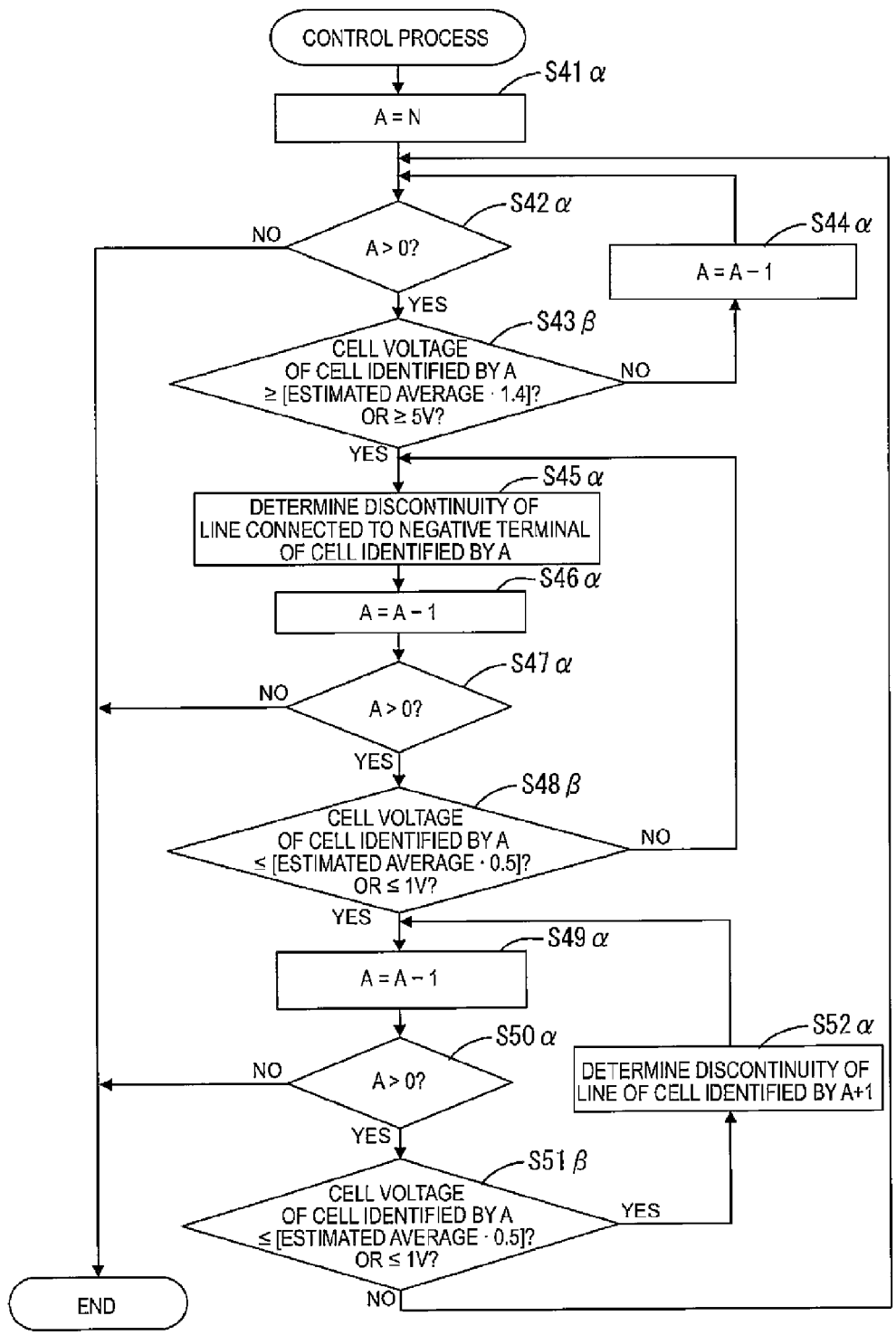
FIG. 9 is a flowchart illustrating a middle portion steps according to a third embodiment.

The third embodiment illustrated in FIG. 9 includes middle portion steps different from those of the first embodiment and the second embodiment. Other configurations are the same as those of the first embodiment and the second embodiment. Steps indicated by step numbers followed by letter β are different from the middle steps in the first embodiment (FIG. 3) and the second embodiment (FIG. 8). The same configurations as those of the first embodiment and the second embodiment will be indicated by the same symbols and will not be explained. The configuration different from those of the first embodiment and the second embodiment will be explained.

A switching sequence in switch control steps and a scanning sequence of scanning the cells in the middle portion steps correspond to each other, which is a different configuration from those of the first embodiment and the second embodiment. In this embodiment, the switching sequence is the descending sequence, which is the same as in the first embodiment and a reversed sequence from that of the second embodiment. The scanning sequence is also the descending sequence, which is the same as in the second embodiment and a reversed sequence from that of the first embodiment.

In the first and the second embodiments, the CPU 70A executes the low abnormality finding step (S43), the high abnormality finding step (S48), and the non-high abnormality finding step (S51) in this sequence. In comparison to the steps illustrated in FIG. 8, the CPU 70A executes a high abnormality finding step (S43β) instead of the low abnormality finding step (S43) and a low abnormality finding step (S48β) instead of the high abnormality finding step (S48). The CPU 70A also executes a non-low abnormality finding step (S51β) instead of the non-high abnormality finding step (S51). In the non-low abnormality finding step, the CPU 70A determines whether the measured cell voltages of the middle cells are the low abnormality cell voltage in the cell scanning sequence.

The CPU 70A determines whether the measured cell voltage of the cell identified by the number A is equal to or smaller than the low abnormality threshold (S51β). If the measured cell voltage is higher than the low abnormality threshold (NO in S51β), the CPU 70A proceeds to step S42α. If the measured cell voltage is equal to or lower than the low abnormality threshold (YES in S51β), the CPU 70A determines that the middle measurement line connected to the positive terminal of the cell identified by the number A+1 has lost continuity (S52α), and returns to step S49α. Through these steps, the discontinuity of the adjacent voltage measurement lines between the cells at the low abnormality cell voltage can be detected.

Other Embodiments

The scope of the present invention is not limited to the above embodiments. The following embodiments are also included in the scope of the technologies described herein.

The cell monitoring device 71 may have a configuration without the zener diodes 11 to 14 or with regular diodes instead of the zener diodes 11 to 14.

The cell monitoring device 71 may have a configuration without the RC filters 101 to 104.

The capacitances of the capacitors 51 to 54 may not be equalized. The periods for closing the switches 21 to 24 in the switch control steps may be set equally to time that is sufficiently long for the capacitor having the largest capacity to be discharged. Alternatively, the periods may be set individually according to the capacitances of the capacitors 51 to 54 corresponding to the switches 21 to 24.

The cell monitoring unit 70 may include multiple CPUs for executing the control process. Alternatively, the cell monitoring unit 70 may include hardware circuits for executing the control process instead of the programs, for instance, an application specific integrated circuits (ASICs) of field-programmable gate arrays (FPGAs). Furthermore, the cell monitoring unit 70 may include both hardware circuits and a CPU (or CPUs) for executing the control process. At least two of a set of the switch control steps, a set of the cell voltage measurement steps, a set of the low potential-side steps, a set of the high potential-side steps, a set of the threshold alteration steps, and a set of the middle portion steps may be performed by different CPUs or hardware circuits.

The cell monitoring unit 70 may be configured to simply detect the discontinuity of the voltage measurement lines. In this case, the cell monitoring unit 70 may be configured to detect only at least one of the edge-side abnormality cell voltage, the low abnormality cell voltage, and the high abnormality cell voltage. The cell monitoring unit 70 may be configured to determine the discontinuity of the voltage measurement line between the cell at the low abnormality cell voltage and the cell at the high abnormality cell voltage if both low abnormality cell voltage and high abnormality cell voltage are detected. With this configuration, not only the discontinuity of the voltage measurement lines is detected but also an area in which the voltage measurement lines that have lost continuity are located can be estimated.

The period of closing one switch may partly overlap the period of closing the next switch in the switching sequence. In the switch control steps, the adjacent switches may be selected at time to execute the discharge at the same time, then, next adjacent switches shifted by one in the switching sequence may be selected to execute the discharge at the same time. For instance, the fourth and the third switches 24 and 23 may be selected to execute the discharge, and then the second and the first switches 22 and 21 may be selected to execute the discharge. Finally, the first switch 21 may be selected to execute the discharge. With this configuration, the discharge time of the cells 1 to 4 or the capacitors 51 to 54 can be reduced in comparison to the configuration in which the switches are closed and opened one at a time. Furthermore, variations in cell voltages of the cells 1 to 4 after the operations of the switches for the discharge can be reduced.

The cell monitoring unit 70 may be configured to execute the cell voltage measurement in parallel with the switch control steps. The cell voltages may be measured at any time after each switch connected in parallel to the corresponding cell is reopened and the next switch in the switching sequence is closed. For instance, the voltage of the fourth cell 4 may be measured at the fourth switch 24 is reopened and the third switch 23 is closed or after.

The module voltage Em may be defined by calculating a sum of the measured cell voltages obtained through the cell voltage measurement. If the zener voltage is applied to the capacitor due to the discontinuity of the line, the measured cell voltage E may be reduced to 5V from the 6.5V within the measurable range of the cell voltage measurement circuit 70C. Namely, the measured cell voltage is not accurate. As a result, the module voltage Em that is the sum of the measured cell voltages is also not accurate. In the embodiments described earlier, the voltage between the ground line 60 and the fourth measurement line 64 is measured and set as the module voltage Em. Therefore, the accurate module voltage Em can be obtained regardless of the measurable range.

The cell monitoring unit 70 may be configured to execute the low potential-side steps after the high potential-sidesteps. Alternatively, the cell monitoring unit 70 may be configured to execute the high potential-side steps and the low potential-side steps in parallel. Furthermore, the cell monitoring unit 70 may be configured to execute at least one of the set of the low potential-side steps and the set of the high potential-side steps before the switch control steps.

The cell monitoring unit 70 may be configured without the non-high abnormality finding steps or the non-low abnormality finding steps. Even without those steps, the cell monitoring unit 70 still can detect the discontinuity of the middle measurement lines between the cell at the high abnormality cell voltage found through the high abnormality finding steps and the cell at the low abnormality cell voltage found through the low abnormality finding steps.

The switching sequence and the cell scanning sequence may be ascending sequences. The switching sequence is not limited to the ascending sequence or the descending sequence. The switching sequence may be a random sequence. The cell monitoring unit 70 may be configured to execute the control process for some of the cells 1 to 4 and some of the switches corresponding to the some of the cells 1 to 4. With this configuration, whether the voltage measurement lines connected to the selected cells have lost continuity can be determined.

What is claimed is:

1. A cell monitoring device for monitoring a plurality of cells connected in series in an electric storage module, the cell monitoring device comprising:
a plurality of electric lines;
a plurality of switches connected in parallel to the cells, respectively, via the electric lines; and
a controller configured to:
close and reopen at least two of the switches in a predetermined sequence;
measure voltages between the electric lines connected to the cells after the switches connected in parallel to the cells are reopened and the next switches in the predetermined sequence are closed, respectively;
determine the measured voltages as cell voltages of the cells;
determine whether at least one of a high abnormality voltage and a low abnormality voltage, the high abnormality voltage being equal to or higher than a first threshold, the low abnormality voltage being equal to or lower than a second threshold lower than the first threshold exists among the cell voltages; and
determine that at least one of the electric lines has lost continuity if at least one of the high abnormality voltage and the low abnormality voltage exists among the cell voltages.

2. The cell monitoring device according to claim 1, wherein the controller is configured to determine discontinuity of the electric line between the cell having the high abnormality cell voltage and the cell having the low abnormality cell voltage if the high abnormality cell voltage and the low abnormality cell voltage both exist among the cell voltages.

3. The cell monitoring device according to claim 1, wherein the controller is configured to:
close and reopen at least two of the switches in a switching sequence from a first end of the electric storage module to a second end of the electric storage module;
measure a voltage between the electric lines connected to each cell after the switch connected in parallel to the cell is reopened and the next switch in the switching sequence is closed; and
determine the measured voltage as the cell voltage of the cell.

4. The cell monitoring device according to claim 3, wherein the controller is configured to:
determine whether the cell voltages of the cells are the low abnormality cell voltage in a cell scanning sequence opposite to the switching sequence from the cell located at the second end;
determine whether the cell voltages are the high abnormality cell voltage in the cell scanning sequence from the cell next to the cell having the low abnormality cell voltage if one of the cell voltages at the low abnormality cell voltage is determined; and
determine whether the cell voltages are not the high abnormality cell voltage in the cell scanning sequence from the cell next to the cell at the high abnormality cell voltage if at least one of the cell voltages at the high abnormality cell voltage is determined,
wherein the controller determines that the at least the electric lines between the cell having the low abnormality cell voltage and the cell having the high abnormality cell voltage has lost continuity if only the at least one of the cell voltages is determined as the high abnormality cell voltage, and
wherein the controller determines that the last one of the electric lines between the cell having the low abnormality cell voltage and the cell having the high abnormality cell voltage has lost continuity if a plurality of the cell voltages are determined as the high abnormality cell voltage.

5. The cell monitoring device according to claim 3, wherein the controller is configured to:
determine whether the cells have the high abnormality cell voltage in a cell scanning sequence equal to the switch scanning sequence from the cell located at the first end;
determine, if one of the cells is determined as the high abnormality cell voltage, whether the cells have the low abnormality cell voltage in the cell scanning sequence from the cell next to the cell having the high abnormality cell voltage;
determine, if one of the cells is determined as the low abnormality cell voltage, whether the cells do not have the low abnormality cell voltage in the cell scanning sequence from the cell next to the cell having the low abnormality cell voltage; and
determine that the at least one of the electric lines between the cell having the high abnormality cell voltage and the cell having the low abnormality cell voltage has lost continuity if only the at least one of the cell voltages is determined as the low abnormality cell voltage, and
wherein the controller determines that the last one of the electric lines between the cell having the high abnormality cell voltage and the cell having the cell voltage at the low abnormality cell voltage has lost continuity if a plurality of the cell voltages are determined as the low abnormality cell voltage.

6. The cell monitoring device according to claim 1, wherein the controller is configured to:
measure a module voltage between the electric lines connected to outermost terminals of the cells; and
alter the first threshold and the second threshold according to the module voltage such that the first threshold and the second threshold become lower as the module voltage becomes lower.

7. The cell monitoring device according to claim 1, wherein the controller is configured to:
determine whether the cell voltage of at least one of the outermost cells at least one of ends of the electric storage module is equal to or lower than a third threshold;
determine whether the cell voltage of at least one of the consecutive cells from the at least one of the outermost cells is equal to or lower than the third threshold if the cell voltage of the at least one of the outermost cells is lower than the third threshold;
determine that the cell voltage of the at least one of the outermost cells and the consecutive cells as an edge-side abnormality cell voltage if the cell voltage of the at least one of the outermost cells and the consecutive cells is equal to or lower than the third threshold; and
determine that one of the electric lines connected to the cell having the edge-side abnormality cell voltage, the one of the electric lines being closer to the at least one of ends of the electric storage module has lost continuity.

8. The cell monitoring device according to claim 7, wherein the controller is configured to, if the cell voltages of a plurality of the cells are the edge-side abnormality cell voltage, use the cell voltage of the innermost cell among the plurality of the cells having the edge-side abnormality cell voltage for determination of the low abnormality cell voltage.

9. The cell monitoring device according to claim 7, wherein the controller is configured to:
measure a module voltage between the electric lines connected to outermost terminals of the cells;

count a number of the cells having the edge-side abnormality cell voltage;
subtract the number of the cells from a sum of the plurality of the cells;
calculate an estimated voltage by dividing the module voltage by a result of the subtraction; and
alter the first threshold and the second threshold according to the estimated voltage such that the first threshold and the second threshold become lower as the estimated voltage becomes lower.

10. The cell monitoring device according to claim 6, further comprising a plurality of constant voltage components having a reaction voltage and connected in parallel to the cells, respectively, wherein the first threshold is altered within a range having an upper limit equal to any one of the reaction voltage of the constant voltage components and the highest voltage in a measurable range of the cell voltages.

11. The cell monitoring device according to claim 9, further comprising a plurality of constant voltage components having a reaction voltage and connected in parallel to the cells, respectively, wherein the first threshold is altered within a range having an upper limit equal to any one of the reaction voltage of the constant voltage components and the highest voltage in a measurable range of the cell voltages.

12. A non-transitory computer readable medium having stored thereon computer-readable instructions that, when executed, cause a cell monitoring device for monitoring a plurality of cells connected in series in an electric storage module to:
close and reopen at least two of the switches in a predetermined sequence;
measure voltages between the lines connected to the cells after the switches connected in parallel to the cells are reopened and the next switches in the predetermined sequence are closed, respectively;
determine the measured voltages as cell voltages of the cells;
determine whether at least one of a high abnormality voltage equal to or higher than a first threshold and a low abnormality voltage equal to or lower than a second threshold lower than the first threshold exists among the cell voltages; and
determine at least one of the electric lines has lost continuity if at least one of the high abnormality voltage and the low abnormality voltage exists among the cell voltages.

13. A method of detecting discontinuity of electric lines, the method comprising:
closing and reopening at least two of the switches in a predetermined sequence;
measuring voltages between the lines connected to the cells after the switches connected in parallel to the cells are reopened and the next switches in the predetermined sequence are closed, respectively;
setting the measured voltages as cell voltages of the cells;
determining whether at least one of a high abnormality voltage equal to or higher than a first threshold and a low abnormality voltage equal to or lower than a second threshold lower than the first threshold exists among the cell voltages; and
determining at least one of the electric lines has lost continuity if at least one of the high abnormality voltage and the low abnormality voltage exists among the cell voltages.

* * * * *